US010333279B2

(12) United States Patent
Ochiai et al.

(10) Patent No.: US 10,333,279 B2
(45) Date of Patent: Jun. 25, 2019

(54) QUANTUM CASCADE LASER DEVICE

(71) Applicant: HAMAMATSU PHOTONICS K.K., Hamamatsu-shi, Shizuoka (JP)

(72) Inventors: Takahide Ochiai, Hamamatsu (JP); Tadataka Edamura, Hamamatsu (JP); Naota Akikusa, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 867 days.

(21) Appl. No.: 14/923,861

(22) Filed: Oct. 27, 2015

(65) Prior Publication Data

US 2018/0254610 A1    Sep. 6, 2018

(30) Foreign Application Priority Data

Dec. 8, 2014  (JP) .................................. 2014-248329

(51) Int. Cl.
*H01S 5/34*   (2006.01)
*H01S 5/022*  (2006.01)
*H01S 5/12*   (2006.01)
*H01S 5/024*  (2006.01)

(52) U.S. Cl.
CPC ............ *H01S 5/3402* (2013.01); *H01S 5/024* (2013.01); *H01S 5/0228* (2013.01); *H01S 5/02252* (2013.01); *H01S 5/02288* (2013.01); *H01S 5/12* (2013.01); *H01S 5/3419* (2013.01); *H01S 5/02208* (2013.01); *H01S 5/02236* (2013.01); *H01S 5/02415* (2013.01)

(58) Field of Classification Search
CPC ............ H01S 5/02252; H01S 5/02415; H01S 5/02212; H01S 5/02288; H01S 5/3401; H01S 5/3402; H01S 5/3419; H01S 5/02208; H01S 5/12
See application file for complete search history.

(56) References Cited

U.S. PATENT DOCUMENTS

| 6,759,687 B1* | 7/2004 | Miller ................. H01L 33/58 257/432 |
| 7,092,418 B2* | 8/2006 | Stewart ............. H01S 5/02212 372/36 |
| 2003/0128422 A1* | 7/2003 | Nakazawa ........... B82Y 20/00 359/344 |

(Continued)

FOREIGN PATENT DOCUMENTS

| JP | H1-151285 | 6/1989 |
| JP | 8-279647 A | 10/1996 |

(Continued)

*Primary Examiner* — Michael Carter
(74) *Attorney, Agent, or Firm* — Drinker Biddle & Reath LLP

(57) ABSTRACT

A quantum cascade laser device has a light-absorbing cover member located between one emission end face of a quantum cascade laser element and an emission window of a housing. The emission end face and an opposing surface of a submount with respect to the cover member are flush with each other. The cover member has an opening at a position opposing the emission end face. The opening has a tapered first opening part increasing its diameter from the emission end face side to the emission window side and a second opening part formed with a fixed diameter not smaller than the smallest diameter of the first opening part.

9 Claims, 6 Drawing Sheets

(56) References Cited

U.S. PATENT DOCUMENTS

| | | | | |
|---|---|---|---|---|
| 2003/0219054 | A1* | 11/2003 | Capasso | B82Y 20/00 372/50.22 |
| 2005/0123010 | A1* | 6/2005 | Wu | H01S 5/02288 372/29.022 |
| 2007/0291804 | A1* | 12/2007 | Day | B82Y 20/00 372/36 |
| 2009/0129783 | A1* | 5/2009 | Ori | G02B 6/4246 398/136 |

FOREIGN PATENT DOCUMENTS

| | | |
|---|---|---|
| JP | 2003-163396 | 6/2003 |
| JP | 2008-060396 A | 3/2008 |
| JP | H10-4242 A | 3/2008 |
| JP | 2008-177366 A | 7/2008 |
| WO | WO 2014/048832 | 4/2014 |

\* cited by examiner

QUANTUM CASCADE LASER DEVICE

TECHNICAL FIELD

The present invention relates to a quantum cascade laser device.

BACKGROUND

Light in a mid-infrared region (e.g., where the wavelength is on the order of 5 μm to 30 μm) is an important wavelength region in the field of spectroscopic measurement, for example. Attention has been focusing on quantum cascade laser (QCL) elements as high-performance semiconductor light sources in such a wavelength region (see, for example, Japanese Patent Application Laid-Open Nos. H08-279647, 2008-177366, 2008-60396, and H10-4242).

The quantum cascade laser element is a laser element of monopolar type which utilizes a level structure caused by subbands formed in a semiconductor quantum well structure, so as to generate light according to electronic transitions between the subbands. The quantum cascade laser element achieves highly efficient, high output operations by cascade-connecting multiple stages of quantum well light-emitting layers, each of which is constituted by a quantum well structure and serves as an active region. The cascade connection of quantum well light-emitting layers is attained by using electron injection layers for injecting electrons to upper emission levels and stacking the quantum well light-emitting layers and injection layers alternately.

SUMMARY

When using a quantum cascade laser element as a single-mode laser of CW-driven distributed feedback type for spectroscopic measurement, for example, it has been a common practice to join a submount mounted with the quantum cascade laser element to a heatsink and a temperature control element and put them into a housing having dry nitrogen enclosed therein, so as to form a package in order to stabilize oscillation wavelengths.

Such a package employs a structure in which laser light emitted from one end face of the quantum cascade laser element is taken out of an emission window provided in the housing. In this case, if laser light emitted from the other end face of the quantum cascade laser element is randomly reflected within the housing so that stray light leaks out, it may cause noise at the time of spectroscopic measurement. Though the noise can be canceled when the quantum cascade laser element is driven in a pulsating manner, interference by the stray light may affect baselines of measurement results in the case of driving in the CW manner, thereby lowering the measurement sensitivity.

In this regard, a structure applying a black coating to members within the housing in order to inhibit the stray light from leaking and a structure attaching a cover member provided with a pinhole to the quantum cascade laser element have conventionally been studied. However, it is practically difficult for the former to apply the black coating to all the members within the housing, while the latter cannot deal with radiation angles of laser light in the mid-infrared region and thus may block the laser light that is supposed to be taken out.

For solving the problems mentioned above, it is an object of the present invention to provide a quantum cascade laser device which can inhibit stray light from leaking out, while maintaining an emission efficiency of laser light.

For solving the above-mentioned problems, the quantum cascade laser device in accordance with one aspect comprises a hollow housing having an emission window for emitting laser light to outside; the housing having therewithin a heatsink, a submount secured to the heatsink, a quantum cascade laser element secured to the submount, and a cover member opposing the submount so as to be located between one emission end face of the quantum cascade laser element and the emission window and having a light absorption property for the laser light emitted from the one emission end face and the other emission end face of the quantum cascade laser element; the one emission end face of the quantum cascade laser element and a surface opposing the cover member in the submount being flush with each other; the cover member having an opening, located at a position opposing the one emission end face, for passing therethrough the laser light toward the emission window; the opening having a tapered first opening part increasing a diameter from the one emission end face side to the emission window side and a second opening part formed with a fixed diameter not smaller than the smallest diameter of the first opening part on the one emission end face side of the first opening part.

In this quantum cascade laser device, the light-absorbing cover member located between one emission end face of the quantum cascade laser element and the emission window absorbs stray light of the laser light within the housing, whereby the stray light can be inhibited from leaking out. The cover member is provided with an opening at a position opposing the one emission end face. Since the opening is provided with the tapered first opening part, even when the laser light emitted from the one emission end face has a large radiation angle, the cover member can be prevented from blocking the laser light, whereby the emission efficiency of laser light from the emission window can be maintained. Since the second opening part formed with a fixed diameter not smaller than the smallest diameter of the first opening part is disposed on the one emission end face side of the first opening part, the one emission end face can be arranged close to the opening without coming into contact with the cover member. Therefore, even when the opening diameter of the first opening part is narrowed, the cover member is inhibited from blocking the laser light, whereby the suppression of leakage of stray light to the outside and the maintenance of the emission efficiency of laser light can be achieved at the same time.

The cover member may be in contact with the surface opposing the cover member in the submount, while the one emission end face of the quantum cascade laser element is located at an opening end of the second opening part in the cover member. In this case, the one emission end face can be arranged closer to the opening part. Thus the stray light can more securely be inhibited from leaking out.

The opening may further have a third opening part for positioning a lens on the emission window side of the first opening part. This can position the lens with a simple structure.

The cover member may have an extension part extending to the heatsink side of the other emission end face of the quantum cascade laser element along a surface for securing the quantum cascade laser element in the submount. In this case, the laser light emitted from the other emission end face can efficiently be absorbed by the extension part of the cover member. Thus the stray light can more securely be inhibited from leaking out.

The heatsink may have an opposing surface opposing in a tilted state the other emission end face of the quantum cascade laser element. This can prevent the laser light emitted from the other emission end face from being regularly reflected toward the quantum cascade element and returning there. Therefore, operations of the quantum cascade laser element can be stabilized.

The housing may be constituted by a bottomed main part and a lid part provided with the emission window, the lid part having a black-processed inner side face. In this case, the inner side face of the lid part absorbs stray light, whereby the stray light can more securely be inhibited from leaking out.

The whole inner side face of the housing may be black-processed. In this case, the whole inner side face of the housing absorbs stray light, whereby the stray light can more securely be inhibited from leaking out.

The housing may be filled with dry nitrogen. This can prevent dew condensation from occurring within the housing.

The quantum cascade laser element may be a laser element of CW-driven distributed feedback type. When the quantum cascade laser element is used for spectroscopic measurement, interference by the stray light may affect baselines of measurement results, thereby lowering the measurement sensitivity. The above-mentioned structure can inhibit stray light from leaking out and thereby favorably suppress interference by the stray light at the time of spectroscopic measurement.

As in the foregoing, one aspect of the present invention can inhibit stray light from leaking out, while maintaining the emission efficiency of laser light.

DETAILED DESCRIPTION

In the following, preferred embodiments of the quantum cascade laser device in accordance with the present invention will be explained in detail with reference to the drawings.

Figure 1:
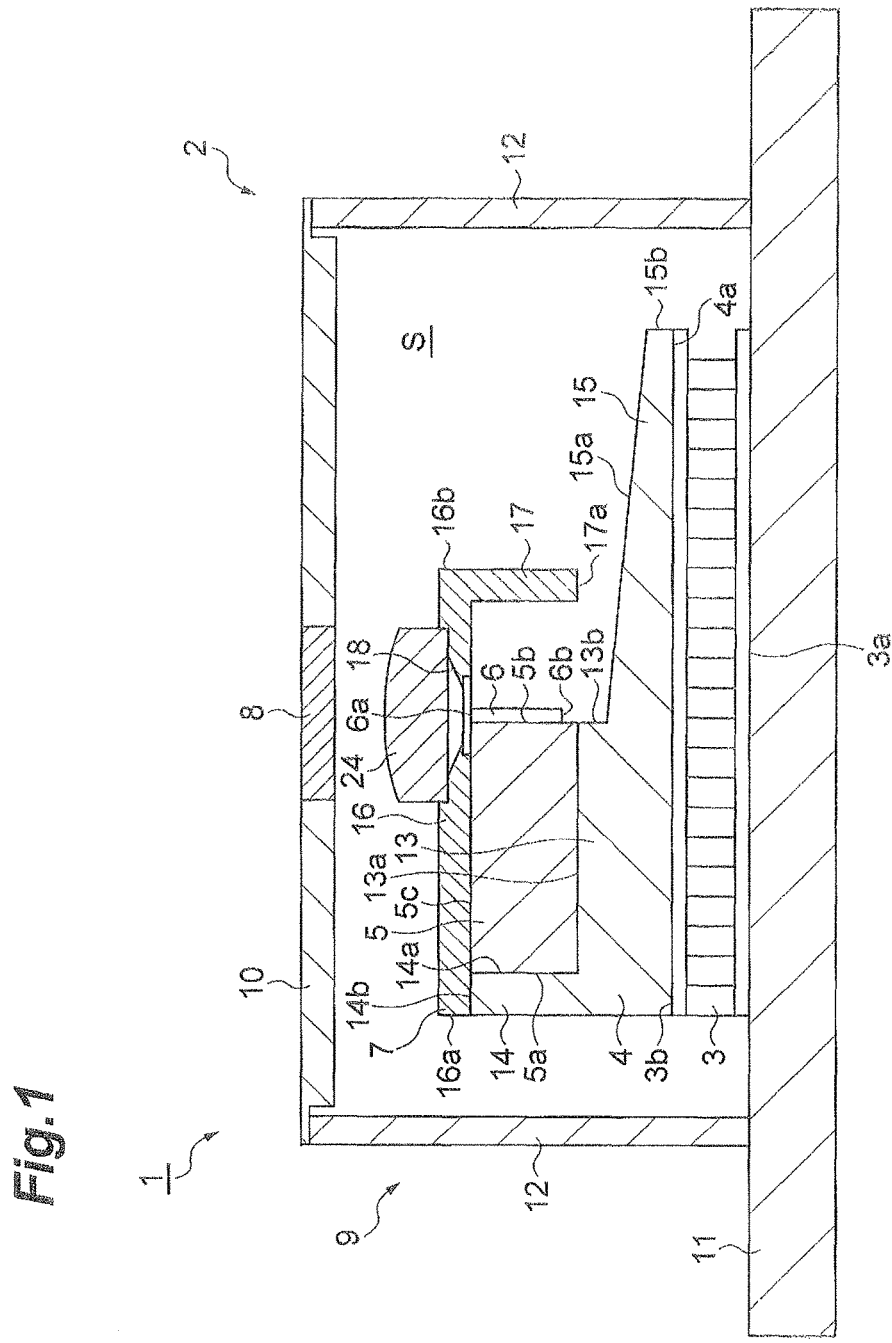
FIG. 1 is a sectional view illustrating one embodiment of a quantum cascade laser device.

FIG. 1 is a sectional view illustrating one embodiment of the quantum cascade laser device. As illustrated in this drawing, the quantum cascade laser device 1 comprises a housing 2, a temperature control element 3, a heatsink 4, a submount 5, a quantum cascade laser element 6, and a cover member 7. The quantum cascade laser device 1 is used as a light source for spectroscopic measurement, for example, and employs a structure in which laser light L (see FIG. 4) emitted from the quantum cascade laser element 6 is taken out from an emission window 8 of the housing 2.

The housing 2 is formed into a substantially rectangular parallelepiped shape from a metal, for example. The housing 2 is constituted by a bottomed main part 9 and a lid part 10. The main part 9 has a thickly formed planar bottom part 11 and a side part 12 erected on the bottom part 11.

The base end side of the side part 12 is firmly joined to one surface side of the bottom part 11 by welding, for example. Feed-through terminals, leads, and the like used for driving the temperature control element 3 and quantum cascade laser element 6 are provided in the side part. 12 as appropriate, for example. The bottom part 11 is a little larger than the lid part 10 in size and has a projection part protruding from four surfaces of the side part 12 to the outside in planar view of the housing 2. This secures the stability of mounting the quantum cascade laser device 1.

The lid part 10 has a planar form thinner than the bottom part 11. An edge part of the lid part 10 is firmly joined to the leading end side of the side part 12 by welding, for example. The housing 2 has an inner space S which is made airtight by the main part 9 and lid part 10. The inner space S is in a state filled with dry nitrogen, for example, whereby dew condensation is inhibited from occurring in the housing 2. Formed in the lid part 10 near its center is the circular emission window 8 for taking out of the housing 2 the laser light L emitted from the quantum cascade laser element 6. Examples of window materials for use in the emission window 8 include Ge and ZnSe.

Each of the inner side faces of the housing 2, i.e., the part facing the inner space S in the one surface of the bottom part 11, the inner surface of the side part 12, and the inner surface of the lid part 10, is black-processed. The black processing can be achieved by attaching a black resin sheet containing carbon, for example. Such black processing provides the inner side faces of the housing 2 with a light absorption property for the laser light L emitted from the quantum cascade laser element 6.

The above-mentioned temperature control element 3, heatsink 4, submount 5, quantum cascade laser element 6, and cover member 7 are contained in the inner space S of the housing 2.

The temperature control element 3 is a part which performs temperature control of the quantum cascade laser element 6 according to a control signal from the outside in order to stabilize oscillation wavelengths of the quantum cascade laser element 6. For example, a Peltier element is used as the temperature control element 3. One surface 3a of the temperature control element 3 is secured to the bottom part 11 of the housing 2 by soldering, for example.

The heatsink 4, which is also known as a package heatsink, is a part through which the heat generated in the quantum cascade laser element 6 is released toward the temperature control element 3. The heatsink 4 is formed from a material which is excellent in thermal conductivity such as Cu, for example. One surface 4a of the heatsink 4 is secured to the other surface 3b of the temperature control element 3 by soldering, for example. The heatsink 4 has a mount part 13 mounted with the submount 5, a positioning part 14 for positioning the submount 5 on the mount part 13, and an extension 15 which extends from the mount part 13.

The mount part 13 has a mount surface 13a formed substantially parallel to the one surface 4a of the heatsink 4. The positioning part 14 is erected substantially parallel to the side part 12 of the housing 2 on the base end side of the mount surface 13a and has an abutment surface 14a against which one end face 5a of the submount 5 abuts. The extension 15 has an opposing surface 15a which opposes an emission end face 6b (which will be explained later) of the quantum cascade laser element 6 at a position lower by one step than the leading end side of the mount surface 13a. The opposing surface 15a is tilted by an obtuse angle from the emission end face 6b (the optical axis of the laser light L from the emission end face 6b) so as to be separated more in the optical axis direction from the emission end face 6b with increasing distance from the emission end face 6b. Preferably, the opposing surface 15a is black-processed as with the inner side faces of the housing 2.

The submount 5, which is also known as a laser heatsink, is a part for securing thereto the quantum cascade laser element 6 and releasing toward the heatsink 4 the heat generated in the quantum cascade laser element 6. The submount 5 is formed into a substantially rectangular parallelepiped shape from a material which is excellent in thermal conductivity such as Cu, for example. The submount 5 is mounted on the mount surface 13a while letting one end face 5a abut against the abutment surface 14a and is firmly secured to the heatsink 4 by screwing, for example.

The other end part of the submount 5 is a securing surface 5b having the quantum cascade laser element 6 secured thereto. The securing surface 5b is flush with a step side face 13b between the mount surface 13a and opposing surface 15a at a position corresponding to the emission window 8. The surface opposite to the mount surface 13a in the submount 5 is an opposing surface 5c which opposes the cover member 7. The opposing surface 5c is flush with a leading end face 14b of the positioning part 14. Electrode pads used for driving the quantum cascade laser element 6, wires connected to the electrode pads, and the like, which are not depicted, are also secured to the securing surface 5b.

The quantum cascade laser element 6 is a laser element of monopolar type which utilizes a level structure caused by subbands formed in a semiconductor quantum well structure, so as to generate light according to electronic transitions between the subbands. The quantum cascade laser element 6 operates as being driven in the CW (Continuous Wave) manner and has a distributed feedback structure incorporating a diffraction grating therein in order to obtain a longitudinal single-mode spectrum as a light source for spectroscopic measurement.

The quantum cascade laser element 6 is secured to the securing surface 5b of the submount 5 such that one emission end face 6a and the other emission end face 6b oppose the emission window 8 and the opposing surface 15a of the heatsink 4, respectively. The emission end face 6a is flush with the leading end face 14b of the positioning part 14 in the heatsink 4 and the opposing surface 5c of the submount 5. By "flush" is meant herein that the laser light L emitted from the emission end face 6a does not impinge on the securing surface 5b of the submount 5.

In the distributed feedback structure, only one wavelength corresponding to the period of the diffraction grating is selectively feedback, so as to achieve a single-mode oscillation. In such a structure, an anti-reflection coating is applied to one emission end face 6a (or both of one emission end face 6a and the other emission end face 6b) of the quantum cascade laser element 6 so as not to generate other Fabry-Perot modes. A high-reflection coating may be applied to the other emission end face 6b in order to suppress stray light of the laser light L within the housing 2.

When the reflectance of the emission end face 6b is raised by the high-reflection coating, however, competition with other modes is easier to occur, whereby a stable single-mode oscillation may not be obtained. Therefore, in the quantum cascade laser element 6, the emission end face 6b is left as a cleaved end face without the high-reflection coating.

The quantum cascade laser element 6 also has a refractive index guiding structure in which a light-emitting layer is held between cladding layers, while light having propagated through its waveguide is radiated from the end faces of the element (i.e., emission end faces 6a, 6b) to a free space. Since this refractive index guiding structure can be regarded as a slit in which the thickness part of the active layer is an opening, the laser light L radiated to the free space has a fixed radiation angle because of a diffraction effect of light as in the case where light is released from a minute slit.

Figure 2:
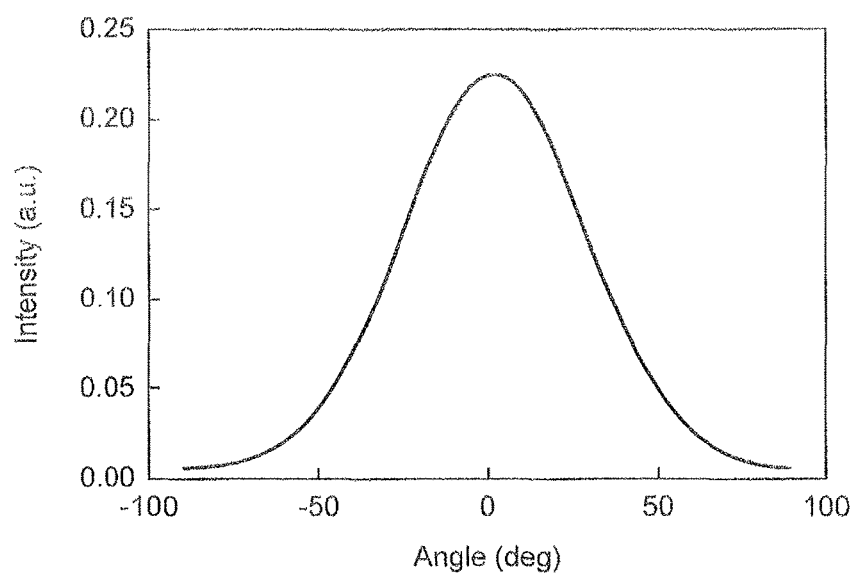
FIG. 2 is a chart illustrating an example of radiation angles of laser light emitted from a quantum cascade laser element.

The diffraction effect of light appears more remarkably as its wavelength is longer. For use in spectroscopic measurement, the restriction to the transverse single mode is also a cause of enhancing the diffraction effect of light. For example, the radiation angle is about 30° (±15° when the direction normal to an end face is taken as 0°) in a near-infrared region which serves as a communication wavelength band, but is 100° or greater in a mid-infrared region having a wavelength of 3 μm or longer. FIG. 2 is a chart illustrating a far-field pattern in a growing direction of a quantum cascade laser element of CW-driven distributed feedback type having a wavelength of 7.2 μm. This chart illustrates data obtained by fitting actually measured values with a Gaussian function, from which it can be seen that the radiation angle ranges about 140°.

Therefore, in order to take out the laser light L from the emission end face 6a of the quantum cascade laser element 6, it is necessary for the inside of the housing 2 to be constructed so as not to block the laser light having a wide radiation angle. On the other hand, the quantum cascade laser element 6 emits the laser light L from the emission end face 6b with a radiation angle similar to that from the emission end face 6a. Therefore, the laser light L emitted from the emission end face 6b may be reflected randomly within the housing 2, so that stray light may leak out of the emission window 8, thereby causing noise at the time of spectroscopic measurement. Hence required is a structure which can inhibit stray light from leaking out, while maintaining the emission efficiency of the laser light L from the emission window 8.

The cover member 7 is a part which suppresses stray light within the housing 2. As illustrated in FIG. 1, the cover member 7 opposes the submount 5 so as to be located between one emission end face 6a of the quantum cascade laser element 6 and the emission window 8. The cover member 7 has a planar main part 16 provided with an opening 18 for passing therethrough the laser light L toward the emission window 8 and a planar extension part 17 bent from an end part of the main part 16 at substantially right angles with respect to the main part 16.

The main part 16 is arranged such as to come into contact with each of the leading end face 14b of the positioning part 14 in the heatsink 4 and the opposing surface 5c of the submount 5 at a position where the opening 18 opposes the one emission end face 6a. The heatsink 4 has a securing surface which is flush with the opposing surface 5c of the submount 5 in the depth direction of FIG. 1, while the main part 16 is firmly secured to the securing surface of the heatsink 4 by screwing or bonding. One end face 16a of the main part 16 is flush with the outer surface side of the positioning part 14 in the heatsink 4, while the other end face 16b of the main part 16 projects out of the securing surface 5b of the submount 5, so as to be located on the extension 15 side of the heatsink 4 beyond the position of the emission window 8.

The extension part 17 extends from the other end side of the main part 16 to the opposing surface 15a of the heatsink 4 substantially in parallel with the securing surface 5b of the submount 5 while being separated from the quantum cascade laser element 6. A leading end face 17a of the extension part 17 is located on the opposing surface 15a side of the heatsink 4 beyond the position of the other emission end face 6b of the quantum cascade laser element 6. The extension part 17 may be made thicker than the main part 16.

Figure 3:
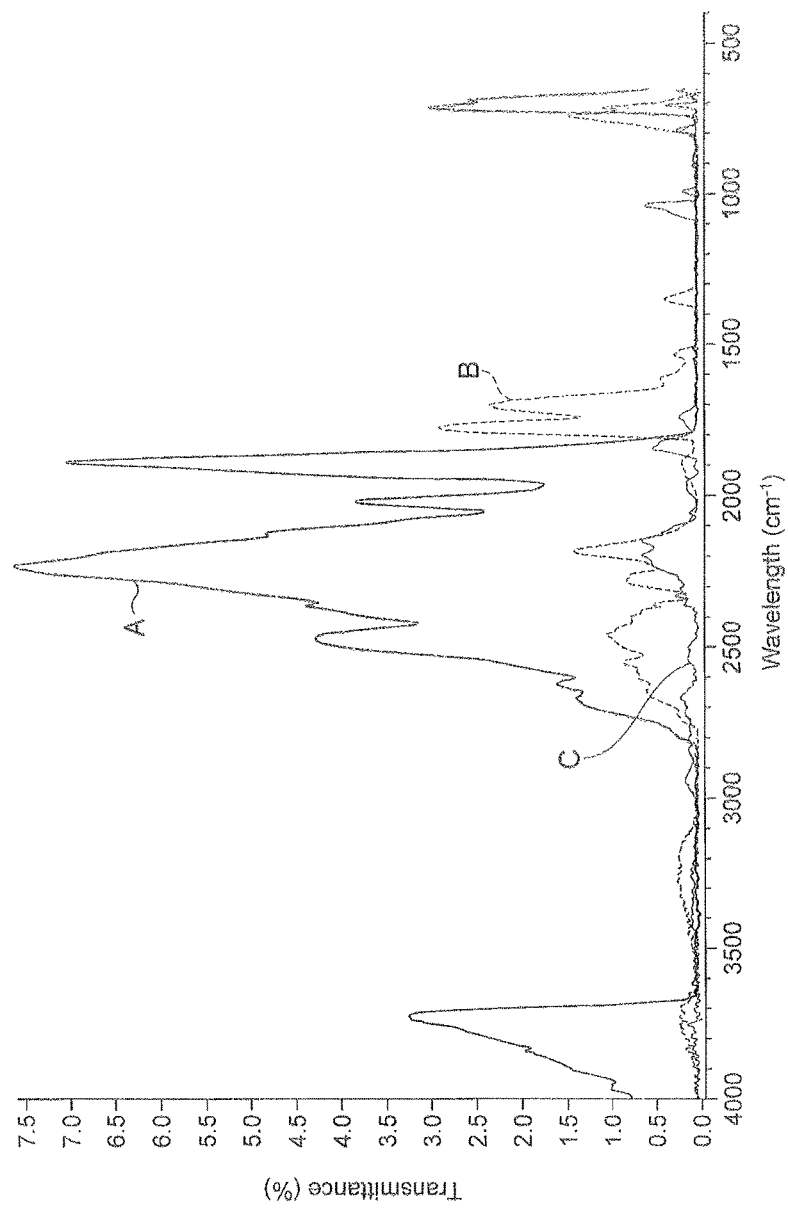
FIG. 3 is a chart illustrating transmission characteristics of resin materials in a mid-infrared region.

As a material for forming the cover member 7, one having a light absorption property for wavelengths in the mid-infrared region is used preferably. FIG. 3 is a chart illustrating transmission characteristics of resin materials in the mid-infrared region. Examples illustrated in the chart, whose abscissa and ordinate respectively indicate wave number (reciprocal of wavelength) and transmittance, plot transmission characteristics of acrylic (graph A), polyoxymethylene (POM) (graph B), and polyetheretherketone (PEEK) (graph C).

Results illustrated in the chart indicate it preferable within the mid-infrared region (where the wavelength ranges from 3 μm to 11 μm, for example) to select the POM or PEEK resin, whose transmittance is sufficiently low throughout the wavelength region, as a material for forming the cover member 7. In particular, the PEEK resin is preferably used from the viewpoints of heat resistance, chemical resistance, mechanical strength, electric insulation, easiness to process, and the like. Preferably, the front face of the cover member 7 is black-processed as with the inner side faces of the housing 2.

Not only resin materials, but ceramic materials may also be used as materials for forming the cover member 7. In this case, the cover member 7b may be formed from $Al_2O_3$ or MN, for example, and then an anti-reflection coating may be applied to the front face.

Figure 4:
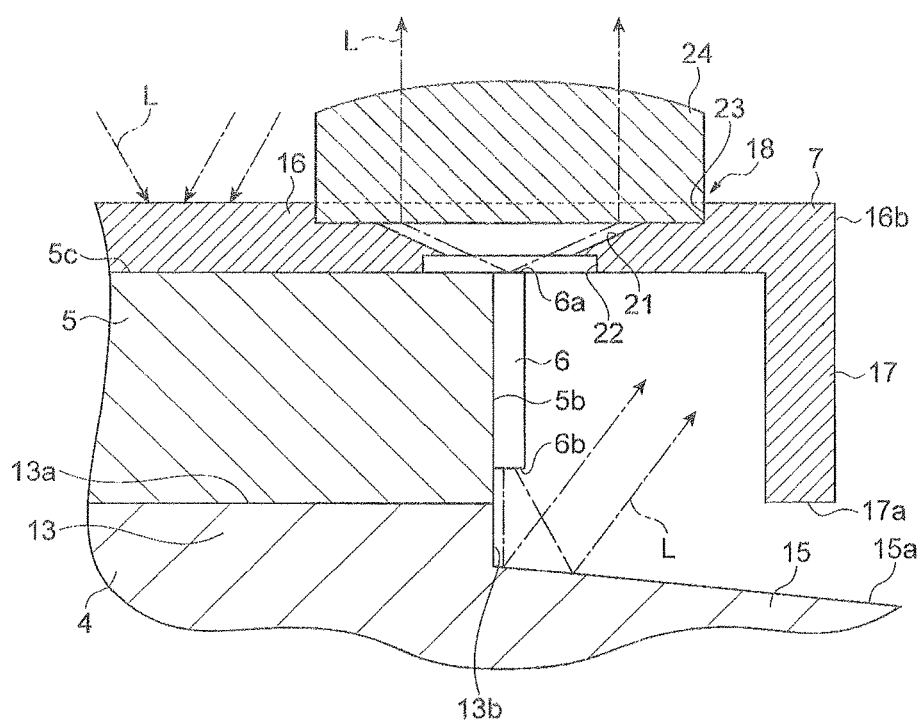
FIG. 4 is an enlarged sectional view of a main part of the quantum cascade laser device illustrated in FIG. 1.

As is also illustrated in FIG. 4, the opening 18 provided in the main part 16 specifically has a first opening part 21, a second opening part 22, and a third opening part 23. The first opening part 21 is located on the center side in the thickness direction of the main part 16 and has a taper form increasing its diameter from one emission end face 6a side to the emission window 8 (see FIG. 1) side.

The taper angle of the first opening part 21 is determined according to the radiation angle of the laser light L emitted from the emission end face 6a. For example, when the radiation angle of the laser light L is 140°, the taper angle of the first opening part 21 is set to 140° (±70° when the direction normal to the emission end face 6a is taken as 0°) or greater. When the thickness of the main part 16 of the cover member 7 is 0.8 mm, the smallest diameter of the first opening part (the diameter on the emission end face 6a side) is set to about 1.5 mm±0.5 mm, for example. The length of the first opening part 21 in the thickness direction of the main part 16 (the direction normal to the emission end face 6a) is set to about 0.3 mm, for example.

The second opening part 22 is located on the emission end face 6a side and formed with a fixed diameter which is not smaller than the smallest diameter of the first opening part 21. The diameter of the second opening 22 is set to about 2.6 mm, for example. The length of the second opening part 22 in the thickness direction of the main part 16 is set to about 0.2 mm, for example.

The third opening part 23 is located on the emission window 8 side and formed with a fixed diameter which is greater than the largest diameter of the second opening part 22 (the diameter on the emission window 8 side). The third opening part 23 is a part for positioning a lens and has a planoconvex lens 24 inserted therein in this embodiment. The laser light L from the emission end face 6a passes through the opening 18 with a predetermined radiation angle and then is turned into parallel light by the planoconvex lens 24, so as to be taken out of the housing 2 through the emission window 8. Preferably, the surface on the cover member 7 side of the planoconvex lens 24 is provided with an anti-reflection coating. The length of the third opening part 23 in the thickness direction of the main part 16 is set to about 0.3 mm, for example.

As explained in the foregoing, the light-absorbing cover member 7 is arranged between one emission end face 6a of the quantum cascade laser element 6 and the emission window 8 in the quantum cascade laser device 1. As illustrated in FIG. 4, the cover member 7 absorbs stray light caused by the laser light L reflected by the opposing surface 15a of the heatsink 4 after having been emitted from the other emission end face 6b and stray list caused by the laser light L reflected by the inner side faces of the housing 2, thereby making it possible to inhibit stray light from leaking out. Suppressing the leakage of stray light can favorably eliminate a problem that interference by the stray light affects baselines of measurement results and thus lowers the measurement sensitivity in the case where the quantum cascade laser element 6 of CW-driven distributed feedback type is used for spectroscopic measurement.

The cover member 7 is provided with the opening 18 at a position opposing one emission end face 6a. Since the opening 18 is provided with the tapered first opening part 21, even when the laser light L emitted from the emission window 8 has a large radiation angle, the cover member 7 can be prevented from blocking the laser light L, whereby the emission efficiency of the laser light L from the emission window 8 can be maintained.

On the other hand, the second opening part 22 formed with a fixed diameter not smaller than the smallest diameter of the first opening part 21 is disposed on the emission end face 6a side of the first opening part 21. This enables the emission end face 6a to be arranged close to the opening 18 without coming into contact with the cover member 7. Therefore, even when the opening diameter of the first opening part 21 is narrowed, the cover member 7 can be inhibited from blocking the laser light L, whereby the suppression of leakage of stray light to the outside and the maintenance of the emission efficiency of the laser light L can be achieved at the same time. Providing the second opening part 22 whose diameter is not smaller than the smallest diameter of the first opening part 21 can also prevent the emission end face 6a from coming into contact with the cover member 7 when assembling the cover member 7 onto the submount 5.

In the quantum cascade laser device 1, the main part 16 of the cover member 7 is in contact with the opposing surface 5c of the submount 5, while one end face 6a of the quantum cascade laser element 6 is located at the opening end of the second opening part 22 in the cover member 7. This enables the one emission end face 6a to be arranged closer to the opening 18.

Figure 5:
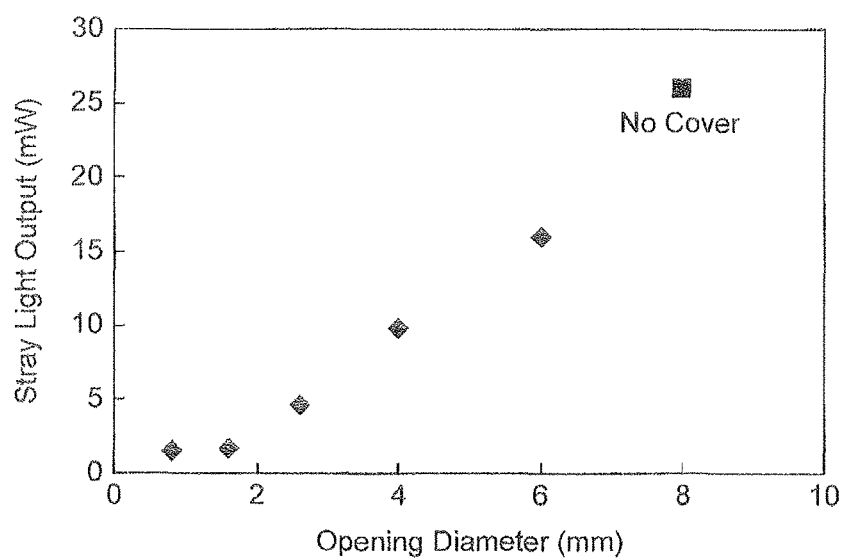
FIG. 5 is a chart illustrating results of an experiment for stray light output.

FIG. 5 is a chart illustrating results of an experiment for stray light output. In this experiment, a high-reflection coating was applied to one emission end face 6a of the quantum cascade laser element 6, so that the laser light L was emitted from only the other emission end face 6b, and the intensity of the laser light L emitted from the emission window 8 was measured as stray light output while changing the opening diameter (the smallest diameter) of the first opening part 21. It is seen from the results illustrated in the chart that the stray light output, which was 26 mW when the cover member 7 was not arranged, gradually decreased as the opening diameter of the first opening part 21 was narrowed by arranging the cover member 7.

The stray light output was about 16 mW and about 9.8 mW when the opening diameter of the first opening part 21 was 6 mm and 4 mm, respectively. The stray light output was about 4.6 mW and about 1.73 mW when the opening diameter of the first opening part 21 was 2.6 mm and 1.6 mm, respectively. The stray light output was about 1.55 mW when the opening diameter of the first opening part 21 was 0.8 mm. The laser light L emitted from one emission end face 6a itself seems to be blocked by the opening 18 when the opening diameter of the first opening part 21 is smaller than 1 mm. Therefore, making the opening diameter of the first opening part 21 fall within the range of at least 1 mm but not greater than 2 mm can favorably achieve the suppression of leakage of stray light to the outside and the maintenance of the emission efficiency of the laser light L.

In the quantum cascade laser device 1, the opening 18 further has the third opening part 23 for positioning the planoconvex lens 24 on the emission window 8 side of the first opening part 21. This can position the planoconvex lens 24 with a simple structure. The lens positioned by the third opening part 23 is not limited to the planoconvex lens 24 but may be changed as appropriate according to specifications of the quantum cascade laser device 1.

In the quantum cascade laser device 1, the cover member 7 is provided with the extension part 7 extending on the heatsink 4 side of the other emission end face 6b of the quantum cascade laser element 6 along the securing surface 5b of the submount 5. The extension part 17 of the cover member 7 can efficiently absorb the laser light L emitted from the other emission end face 6b. Therefore, stray light can more securely be inhibited from leaking out.

In the quantum cascade laser device 1, the heatsink 4 has the opposing surface 15a opposing in a tilted state the other emission end face 6b of the quantum cascade laser element 6. Since the opposing surface 15a is tilted, the laser light L emitted from the other emission end face 6b can be prevented from being regularly reflected toward the quantum cascade element 6 and returning there (see FIG. 4). Therefore, operations of the quantum cascade laser element 6 can be stabilized. In this embodiment, the opposing surface 15a is black-processed and thus can more securely suppress the influence of return light.

In the quantum cascade laser device 1, the entire inner side faces of the housing 2 are black-processed. As a consequence, stray light is absorbed by the entire inner side faces of the housing 2 and thus can more securely be inhibited from leaking out. Instead of the entire inner side faces of the housing 2, the inner side face of the lid part 10 may be black-processed alone. When black-processed, the inner side face of the lid part 10 provided with the emission window can efficiently absorb stray light.

Figure 6:
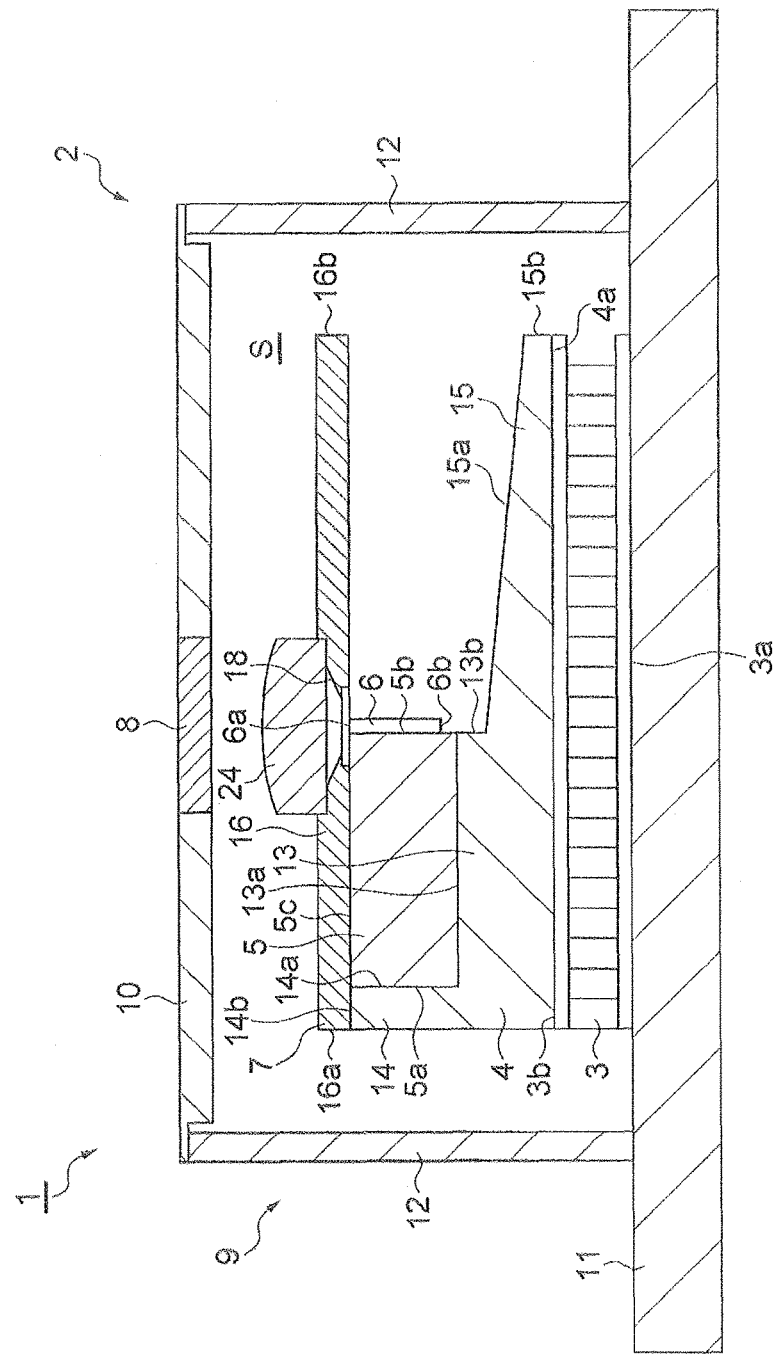
FIG. 6 is a sectional view illustrating a modified example of the quantum cascade laser device.

FIG. 6 is a sectional view illustrating the quantum cascade laser device in accordance with a modified example. As illustrated in this drawing, the quantum cascade laser device 1 in accordance with the modified example differs from the first embodiment in that the cover member 1 is not provided with the extension part 17. More specifically, in the quantum cascade laser device 1, the main part 16 in the cover member 7 projects beyond the securing surface 5b of the submount 5, so that the other end face 16b extends to the position of the leading end face 15b of the extension 15 of the heatsink 4 beyond the position of the emission window 8. Such a structure also enables the cover member 7 to efficiently absorb the laser light emitted from the other emission end face 6b of the quantum cascade laser element 6, thereby inhibiting stray light from leaking out. It can also simplify the form of the cover member 7.

REFERENCE SIGNS LIST

1: quantum cascade laser device; 2: housing; 4: heatsink; 5: submount; 5b: securing surface; 5c: opposing surface; 6: quantum cascade laser element; 6a: one emission end face; 6b: the other emission end face; 7: cover member; 8: emission window; 9: main part; 10: lid part; 15a: opposing surface; 17: extension part; 18: opening; 21: first opening part; 22: second opening part; 23: third opening part; L: laser light.

What is claimed is:

1. A quantum cascade laser device comprising a hollow housing having an emission window for emitting laser light to outside;
   the housing having therewithin:
   a heatsink;
   a submount secured to the heatsink;
   a quantum cascade laser element secured to the submount; and
   a cover member opposing the submount so as to be located between one emission end face of the quantum cascade laser element and the emission window and having a light absorption property for the laser light emitted from the one emission end face and another emission end face of the quantum cascade laser element;
   the one emission end face of the quantum cascade laser element and a surface opposing the cover member in the submount being flush with each other;
   the cover member having an opening, located at a position opposing the one emission end face, for passing therethrough the laser light toward the emission window;
   the opening having a tapered first opening part increasing a diameter from the one emission end face side to the emission window side and a second opening part formed with a fixed diameter not smaller than the smallest diameter of the first opening part on the one emission end tee side of the first opening part.

2. A quantum cascade laser device according to claim 1, wherein the cover member is in contact with the surface opposing the cover member in the submount; and
   wherein the one emission end face of the quantum cascade laser element is located at an opening end of the second opening part in the cover member.

3. A quantum cascade laser device according to claim 1, further having a third opening part for positioning a lens on the emission window side of the first opening part.

4. A quantum cascade laser device according to claim 1, wherein the cover member has an extension part extending to the heatsink side of the another emission end face of the quantum cascade laser element along a surface for securing the quantum cascade laser element in the submount.

5. A quantum cascade laser device according to claim 1, wherein the heatsink has an opposing surface opposing in a tilted state the another emission end face of the quantum cascade laser element.

6. A quantum cascade laser device according to claim 1, wherein the housing is constituted by a bottomed main part and a lid part provided with the emission window; and
   wherein the lid part has a black-processed inner side face.

7. A quantum cascade laser device according to claim 1, wherein
   the whole inner side face of the housing is black-processed.

8. A quantum cascade laser device according to claim 1, wherein the housing is filled with dry nitrogen.

9. A quantum cascade laser device according to claim 1, wherein the quantum cascade laser element is a laser element of CW-driven distributed feedback type.

* * * * *